July 2, 1963
W. L. LEE
3,096,487
DIRECTLY COUPLED TRANSISTOR AMPLIFIER WITH POSITIVE AND NEGATIVE FEEDBACK
Filed April 3, 1961
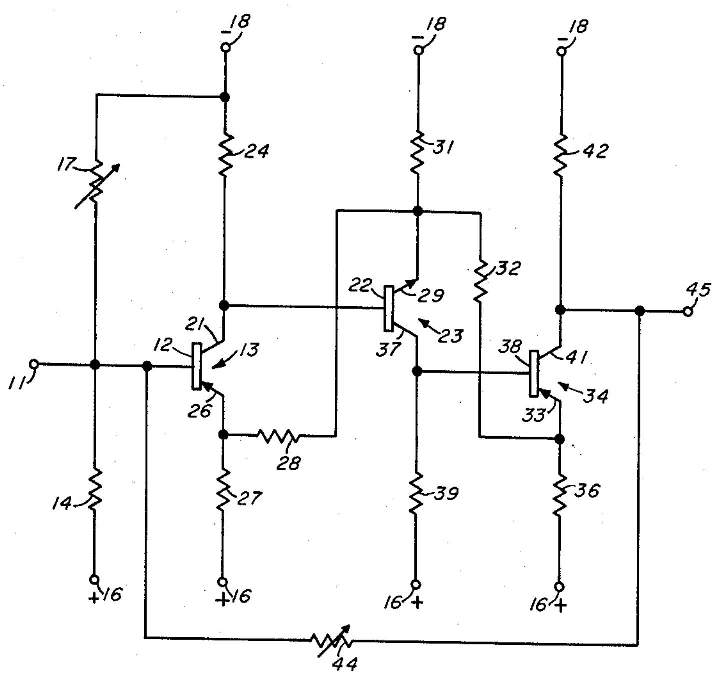
INVENTOR.
WILLIS L. LEE

United States Patent Office 3,096,487

Patented July 2, 1963

3,096,487

DIRECTLY COUPLED TRANSISTOR AMPLIFIER WITH POSITIVE AND NEGATIVE FEEDBACK

Willis L. Lee, 4118 Seri Road, San Diego, Calif.

Filed Apr. 3, 1961, Ser. No. 100,363
8 Claims. (Cl. 330—17)

The present invention relates to a transistor amplifier and more particularly to a multistage directly coupled transistor amplifier utilizing transistors of different conductivity types.

The prior art multistage directly coupled transistor amplifiers have all had serious disadvantages resulting in undesirable limitations. One of the more serious of these disadvantages lies in the inherent operating voltage changes resulting from D.C. coupling, i.e., if the same conductivity type transistor is utilized, the operating voltage keeps moving up as the amplification progresses, which limits the amount of amplification or the number of stages which can be effectively utilized. Another disadvantage of the prior art lies in the effect of components aging and variances in component values and characteristics of individual transistors utilized on the operating potentials. This, of course, will often drive the last or latter stages completely off the linear portion of their transfer characteristic curves. A further disadvantage of the prior art direct coupled amplifiers is the difference in D.C. levels of the input terminal and the output terminal. This difference in D.C. levels renders direct coupled feedback between input and output extremely difficult if not completely impractical.

According to the invention, a transistor amplifier of at least three stages is cascaded, utilizing direct interstage coupling. Each transistor in the amplifier is of the opposite conductivity type to the adjacent transistor or transistors. Thus, for example, in the case of a three stage amplifier, the center transistor would be of the opposite conductivity to the first and last transistors. Regenerative feedback is directly coupled from each stage to the preceding stage and degenerative feedback is directly coupled from the output terminal to the input terminal. These features result in a directly coupled cascaded amplifier which has excellent quiescent stability and allows for a directly coupled negative feedback between the output and input terminals thereof with substantially no direct current flowing from one to the other, as well as allowing for an indefinite number of directly coupled cascaded amplifier stages with a single power supply.

It is thus an object of the present invention to provide a cascaded directly coupled transistor amplifier which is extremely stable and utilizes a minimum of precision components.

Another object is the provision of a directly coupled cascaded amplifier in which the output and input terminals have substantially the same D.C. operating potential.

A further object of the invention is to provide a directly coupled cascaded transistor amplifier in which degenerative feedback can be directly coupled between the output and input stages with substantially no quiescent current.

Still another object is to provide a directly coupled cascaded transistor amplifier utilizing a single power supply.

Still another object of the present invention is the provision of an improved directly coupled cascaded transistor amplifier which is extremely simple, economical and requires a minimum of maintenance and calibration.

Other objects and many of the attendant advantages of this invention will be readily appreciated as the same becomes better understood by reference to the following detailed description when considered in connection with the accompanying drawing and wherein the sole FIGURE is a schematic representation of a preferred embodiment of the invention.

Referring to the drawing there is shown input terminal 11 connected to base 12 of transistor 13. Also connected to input terminal 11 is resistor 14 going to positive terminal 16 of the power supply and variable resistance 17 going to the negative terminal 18 of the power supply. Collector 21 of transistor 13 is connected to base 22 of transistor 23 and through resistance 24 to terminal 18. Emitter 26 of transistor 13 is connected through resistance 27 to terminal 16 and through resistance 28 to emitter 29 of transistor 23. Emitter 29 of transistor 23 is also connected through resistance 31 to terminal 18 and through resistance 32 to emitter 33 of transistor 34. Emitter 33 of transistor 34 is also connected through resistance 36 to terminal 16. Collector 37 of transistor 23 is connected to base 38 of transistor 34 and through resistance 39 to terminal 16. Collector 41 of transistor 34 is connected through resistance 42 to terminal 18. Output terminal 45 is also connected to collector 41. Variable resistance 44 is connected between input terminal 11 and output terminal 45.

*Operation*

It will be noted that transistors 13 and 34 are of the PNP type, i.e., the collectors are returned to the negative terminal 18 of the power supply, and emitters are returned to the positive terminal 16 of the power supply. Transistor 23 is an NPN type, having its emitter returned to the negative terminal 18 of the power supply, and its collector returned to the positive terminal 16 of the power supply. It is emphasized at this point, that all of the transistor types could be reversed with a corresponding reversal of the power supply voltages. An incoming signal at terminal 11 will appear out of phase at collector 21 of transistor 13 which is directly coupled to base 22 of NPN transistor 23. This signal will then appear at collector 37 of transistor 23 in phase with the input signal at terminal 11. This inphase signal is coupled directly to base 38 of transistor 34 and will appear out of phase at collector 41 and output terminal 45. The signal appearing at emitter 33 of transistor 34 will be inphase with the signal appearing at base 38 of transistor 34 and will thus, be out of phase with the signal appearing on emitter 29 of transistor 23. This signal appearing on emitter 33 of transistor 34 is fed back to emitter 29 of transistor 23 through resistance 32 resulting in regenerative feedback between the output and second stages. This directly coupled feedback also serves to set the operating potentials on emitter 33 and emitter 29 of transistors 34 and 23, respectively. The signal appearing on emitter 29 is fed back through resistance 28 to emitter 26 of transistor 13. This signal will result in regenerative feedback also, since the signal appearing on emitter 29 of transistor 23 will be out of phase with the signal appearing on emitter 26 of transistor 13. Again, this direct coupled feedback also serves to set the operating potentials on the two emitters 29 and 26, respectively. Obviously, the more closely the operating potentials on the three emitters are controlled, in this case through mutual voltage dividing networks, the more closely the D.C. bias on each stage is set and the less the over all operating voltages on each of the transistor elements are likely to drift, resulting in a highly stable directly coupled cascaded amplifier.

The use or utilization of a transistor of different conductivity as the center stage not only provides or makes possible this direct coupled feedback and bias setting feature, but also enables the design of a three stage direct coupled amplifier in which the input terminal and the output terminal are at the same D.C. level. This not only has the desirable feature of allowing both terminals to be operated at any given potential, depending upon the applied operating voltages, but allows for direct coupled degenerative feedback from between output and input terminals. Resistance 44 is shown as serving this function. By varying the value of resistance 44, the amount of negative feedback can be varied, which varies the overall gain of the three stage cascaded amplifier. This results in a tightly coupled D.C. loop which is substantially self adjusting, i.e., if one voltage anywhere in the loop starts to drift, the combination of interstage regenerative feedback and the D.C. coupling of the output terminal to the input terminal tend to bring the operating potentials back to normal. Resistance 17 is utilized to set the operating potential on base 12 of transistor 13 which will adjust the entire system as pointed out above. Obviously, voltages can be chosen at terminals 16 and 18 to set both input and output terminals at ground potential, which is extremely advantageous in many applications. Suitable isolating means can be employed at input terminal 11 so the output circuitry of the signal source will not effect the feedback loop. While resistance 44 is shown as a single variable resistance, it could take the form of a switched bank of variable resistors for use as a stepped gain control, etc.

It is emphasized at this point that the resistance values of resistances 27, 28 and 31 must be chosen to result in the proper amount of feedback between emitter 29 and emitter 26 and further serve the function of setting the operating potentials on emitters 26 and 29. The same holds true with resistances 31, 32 and 36 in the feedback network between emitters 33 and 29, i.e., the values of these resistances will determine the amplitude of feedback between emitters 33 and 29 and also the operating potentials on these emitters.

Thus, a three stage direct coupled cascaded transistor amplifier has been disclosed which allows for direct coupled feedback between adjacent stages and overall direct coupled feedback between the output and input terminals. Also provided is a simple inexpensive means of stabilizing operating potentials and achieving the same D.C. level at the input and output terminals thereof.

Obviously, while a three stage amplifier has been shown and described, the invention is certainly not limited to a three stage amplifier. It can easily be seen and understood by those skilled in the art, that any odd number of stages can be utilized as long as the input and output transistors are of the same conductivity types and any transistors placed in a signal chain in between said input and output transistors are of opposite conductivity type to adjacent transistors. Thus, the foregoing disclosure relates to only a preferred embodiment of the invention and is intended to cover all changes and modifications of the example of the invention herein chosen for the purposes of the disclosure, which do not constitute departures from the spirit and scope of the invention.

What is claimed is:

1. A transistor amplifier comprising input and output transistors of one conductivity type, a third transistor of another conductivity type, each of said transistors having base collector and emitter elements, the collector of said input transistor connected to the base of said third transistor, the collector of said third transistor connected to the base of said output transistor, one set of positive and negative supply voltages, each of said transistors connected to the said supply voltages in a common emitter configuration, and first and second signal feedback means connected between said third transistor emitter and said input and output transistor emitters, respectively, said first and second signal feedback means operable to set the output transistor collector operating voltage substantially equal to the input transistor base operating voltage.

2. The transistor amplifier of claim 1 wherein said series of feedback means each comprise a resistor network.

3. The transistor amplifier of claim 1 including degenerative signal feedback means between said output transistor collector and said input transistor base.

4. The transistor amplifier of claim 3 wherein said degenerative feedback means comprises a variable resistance.

5. A transistor amplifier comprising an input and output transistor of one conductivity type, an odd number of intermediate transistors connected in cascade between said input and output transistors, each of said transistors having base collector and emitter elements and being of opposite conductivity type to any adjacent transistor, the base of each transistor following said input transistor connected to the collector of the adjacent previous transistor, positive and negative supply voltages, each of said transistors connected to said supply voltages in a common emitter configuration, a series of signal feedback means connected between the emitters of all adjacent transistors, each of said signal feedback means operable to set the output transistor collector operating voltage substantially equal to the input transistor base operating voltage.

6. The transistor amplifier of claim 5 wherein said series of feedback means each comprise a resistor network.

7. The transistor amplifier of claim 5 including degenerative signal feedback means between said output transistor collector and said input transistor base.

8. The transistor amplifier of claim 7 wherein said degenerative feedback means comprises a variable resistance.

References Cited in the file of this patent

UNITED STATES PATENTS

| | | |
|---|---|---|
| 2,789,164 | Stanley | Apr. 16, 1957 |
| 2,955,259 | Lax | Oct. 4, 1960 |
| 3,003,113 | MacNichol | Oct. 3, 1961 |